United States Patent
Macquistan et al.

(10) Patent No.: US 12,470,045 B2
(45) Date of Patent: Nov. 11, 2025

(54) SEMICONDUCTOR DEVICE WITH SELECTIVE AREA EPITAXY GROWTH UTILIZING A MASK TO SUPPRESS OR ENHANCE GROWTH AT THE EDGES

(71) Applicant: Ciena Corporation, Hanover, MD (US)

(72) Inventors: David Alexander Macquistan, Ottawa (CA); Kelvin Prosyk, Luskville (CA)

(73) Assignee: Ciena Corporation, Hanover, MD (US)

( * ) Notice: Subject to any disclaimer, the term of this patent is extended or adjusted under 35 U.S.C. 154(b) by 451 days.

(21) Appl. No.: 16/885,989

(22) Filed: May 28, 2020

(65) Prior Publication Data

US 2020/0381899 A1 Dec. 3, 2020

Related U.S. Application Data

(63) Continuation-in-part of application No. 16/423,846, filed on May 28, 2019, now Pat. No. 10,852,478.

(51) Int. Cl.
*H01S 5/32* (2006.01)
*H01L 21/02* (2006.01)
(Continued)

(52) U.S. Cl.
CPC ...... *H01S 5/3202* (2013.01); *H01L 21/02293* (2013.01); *H01L 21/02392* (2013.01);
(Continued)

(58) Field of Classification Search
CPC ..... H01S 5/3202; H01S 5/1003; H01S 5/2206
See application file for complete search history.

(56) References Cited

U.S. PATENT DOCUMENTS

| 4,439,268 A | 3/1984 | Coldren et al. |
| 4,727,047 A | 2/1988 | Bozler et al. |

(Continued)

FOREIGN PATENT DOCUMENTS

| JP | 2000101186 A | 4/2000 |
| JP | 2001174658 A | 6/2001 |

(Continued)

OTHER PUBLICATIONS

Kapolnek, "Anisotropic epitaxial growth in GaN selective area epitaxy," 1997, Appl. Phys. Lett. vol. 71, No. 9, pp. 1204-1206. (Year: 1997).*

(Continued)

*Primary Examiner* — Michael Carter
(74) *Attorney, Agent, or Firm* — Baratta Law PLLC; Lawrence A. Baratta, Jr.

(57) ABSTRACT

A method includes obtaining a semiconductor wafer having an orientation in a plane; depositing one or more masks to a semiconductor wafer, wherein each mask is configured to cover a portion of the semiconductor wafer, and wherein each mask includes a perimeter having multiple sides that are substantially aligned along a preferred crystal direction relative to the orientation that provides reduced or enhanced growth enhancement at edges of the substantially aligned sides; and performing Selective Area Epitaxy (SAE) growth on a surface of the semiconductor wafer, wherein the one or more masks inhibit the SAE growth over the associated portion.

10 Claims, 16 Drawing Sheets

(51) Int. Cl.
*H01S 5/10* (2021.01)
*H01S 5/22* (2006.01)
*H10F 71/00* (2025.01)

(52) U.S. Cl.
CPC .......... *H01S 5/1003* (2013.01); *H01S 5/2206* (2013.01); *H10F 71/00* (2025.01)

(56) References Cited

U.S. PATENT DOCUMENTS

| | | | |
|---|---|---|---|
| 5,084,410 | A | 1/1992 | Eguchi et al. |
| 5,799,119 | A | 8/1998 | Rolland et al. |
| 6,058,226 | A | 5/2000 | Starodubov |
| 6,122,416 | A | 9/2000 | Ooba et al. |
| 6,198,854 | B1 * | 3/2001 | Takagi .................. G02F 1/2257 359/332 |
| 6,317,445 | B1 * | 11/2001 | Coleman .................. H01S 5/22 372/45.01 |
| 6,411,764 | B1 | 6/2002 | Lee |
| 6,650,458 | B1 | 11/2003 | Prosyk et al. |
| 6,654,534 | B1 | 11/2003 | Prosyk et al. |
| 6,717,708 | B2 | 4/2004 | Prosyk |
| 7,035,305 | B2 | 4/2006 | Adams et al. |
| 7,184,207 | B1 | 2/2007 | Walker et al. |
| 8,280,201 | B2 * | 10/2012 | Prosyk .................. G02F 1/225 359/239 |
| 8,903,202 | B1 | 12/2014 | Prosyk et al. |
| 8,917,958 | B2 | 12/2014 | Prosyk |
| 9,008,469 | B2 | 4/2015 | Prosyk |
| 9,069,223 | B2 | 6/2015 | Prosyk |
| 9,182,546 | B2 | 11/2015 | Prosyk et al. |
| 9,244,327 | B2 | 1/2016 | Prosyk |
| 9,482,925 | B2 | 11/2016 | Prosyk et al. |
| 9,804,425 | B1 | 10/2017 | Prosyk |
| 2002/0038900 | A1 | 4/2002 | Yamauchi |
| 2003/0081900 | A1 | 5/2003 | Nashimoto |
| 2003/0081922 | A1 | 5/2003 | Ide |
| 2003/0143769 | A1 | 7/2003 | Baek et al. |
| 2005/0095012 | A1 | 5/2005 | Watanabe |
| 2005/0135733 | A1 | 6/2005 | Reid et al. |
| 2005/0169342 | A1 | 8/2005 | Glew et al. |
| 2005/0201437 | A1 | 9/2005 | Reid et al. |
| 2007/0223543 | A1 | 9/2007 | Prosyk et al. |
| 2008/0008416 | A1 | 1/2008 | Prosyk et al. |
| 2011/0305255 | A1 | 12/2011 | Ishimura et al. |
| 2014/0056556 | A1 | 2/2014 | Sasahata et al. |

FOREIGN PATENT DOCUMENTS

| | | |
|---|---|---|
| JP | 2002107681 A | 4/2002 |
| WO | 2007036702 A1 | 4/2007 |

OTHER PUBLICATIONS

Gibbon, "Selective-area low-pressure MOCVD of GaInAsP and related materials on planar InP substrates," 1993, Semicond. Sci. Technol. *, pp. 998-110. (Year: 1993).*

Chih-Wei Hu et al., High Performance 1.55 um InGaAsP Buried-Heterosructure Laser Diodes Fabricated by Single-Step MOCVD Regrowth and Self-Aligned Technique, ECS, Journal of The Electrochemical Society, 154 (4) H263-H267 (2007), pp. 263-267.

Joon Sue Lee et al., Selective-area chemical beam epitaxy of in-plane InAs one-dimensional channels grown on InP(001), InP(111)B, and InP(110) surfaces, Phys. Rev. Materials 3, 084606—Published Aug. 26, 2019.

I. Betty et al., An Empirical Model for High Yield Manufacturing of IOGb/s Negative Chirp InP Mach-Zehnder Modulators, OFC, Mar. 2005, 3 Pages, vol. 3, Canada.

H. N. Klein et al., 1.55um Mach-Zehnder Modulators on InP for optical 40/80 Gbit/s transmission networks, InP and Related Materials Conference, May 2006, pp. 171-173.

R. A Griffin et al., Compact, High Power, MQW InP Mach-Zehnder Transmitters with Fullband Tunability for 10 GB/s DWDM, ECOC, Sep. 2005, pp. 903-904, vol. 4, Canada.

D. Hoffmann et al., 45 Ghz Bandwidth Travelling Wave Electrode Machzehnder Modulator With Integrated Spot Size Converter, 2004 International Conference on Indium Phoshide and Related Materials Conference Proceedings, May 2004, pp. 585-588.

K. Prosyk et al., Low Loss, Low Chirp, Low Voltage, Polarization Independent 40Gb/s Bulk Electro-Absorption Modulator Module, OFC, Mar. 2003, pp. 269-270, vol. 1, U.S.A.

Oct. 6, 2020, International Search Report and Written Opinion for International Application No. PCT/US2020/034888.

O. Kayser et al., "Control of selective area growth of InP," 2300 Journal of Crystal Growth, vol. 112, No. 1, May 2, 1991, pp. 111-122.

T. Sasaki et al., "Novel Structure Photonic Devices Using Selective MOVPE Growth," NEC Research and Development, vol. 33, No. 3, Jul. 1, 1992, pp. 372-381.

Dec. 12, 2024, European Search Report for European Patent Application No. 24 19 9592.

* cited by examiner

TRANSVERSE

PROPAGATION INTO THE PAGE

LATERAL

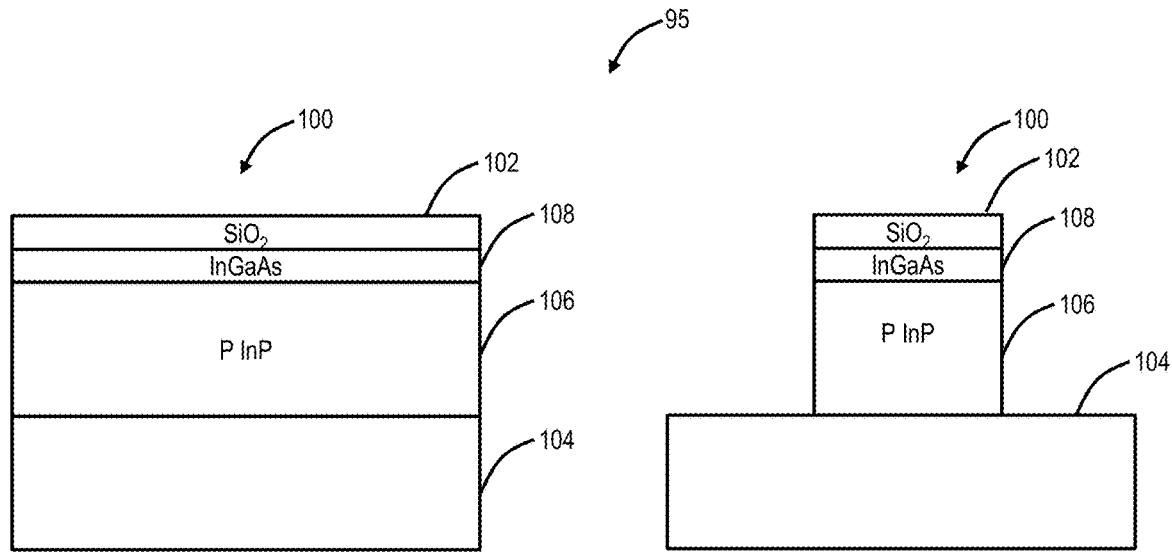
FIG. 9A  FIG. 9B
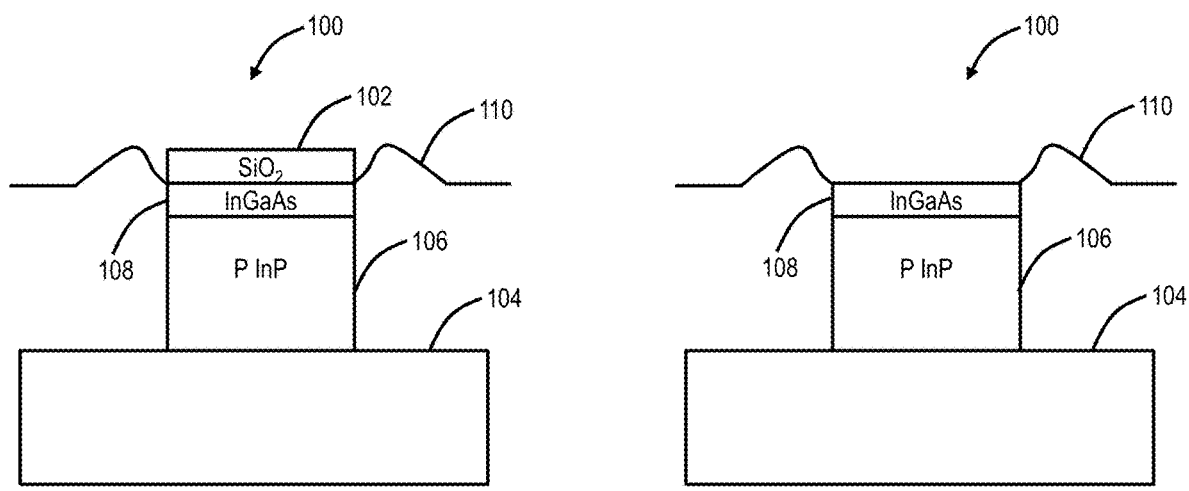
FIG. 9C  FIG. 9D

SEMICONDUCTOR DEVICE WITH SELECTIVE AREA EPITAXY GROWTH UTILIZING A MASK TO SUPPRESS OR ENHANCE GROWTH AT THE EDGES

CROSS-REFERENCE TO RELATED APPLICATIONS

The present disclosure is a continuation-in-part of U.S. patent application Ser. No. 16/423,846, filed May 28, 2019, and entitled "Monolithically Integrated Gain Element," the contents of which are incorporated by reference in their entirety.

FIELD OF THE DISCLOSURE

The present disclosure generally relates to semiconductors, namely photonic components for use in optical devices and optical networks. More particularly, the present disclosure relates to systems and methods for a semiconductor device with Selective Area Epitaxy (SAE) growth utilizing a mask to suppress or enhance growth at the edges and a modulator with a monolithically integrated optical amplifier.

BACKGROUND OF THE DISCLOSURE

The various possible configurations of planar optical waveguides used in Photonic Integrated Circuits (PICs) are often broadly sorted into two categories by their strength of lateral guiding: strongly guided and weakly guided. The strength of lateral guiding determines how well the optical mode is confined to the central portion of the waveguide, and determines the minimum radius of curvature that a curved optical waveguide can achieve before the mode becomes unbound and radiates out of the waveguide. As illustrated in FIG. 1A, a waveguide 3 may consist of a core guiding region 5 with an optical index of refraction of Ng and a laterally adjacent cladding region 7 with optical index of refraction of Nc. Strong guiding refers to a large difference between Ng and Nc. For example, in some Indium Phosphide (InP)-based PICs with strongly-guided waveguides, the guiding core 5 may have an optical index of refraction of Ng=3.54, while the cladding 7 consists of a dielectric material, such as Silicon Dioxide ($SiO_2$), with an index of Nc=1.5. Conversely, weak guiding refers to designs where the core index Ng is only slightly higher than the cladding index Nc. For example, if an InP-based PIC lateral cladding 7 is fabricated from semiconductor instead of silicon dioxide, the guide section 5 would still have Ng=3.54, but the lateral cladding 7 may have Nc=3.46, forming a weak guide. An alternative weak guiding structure is shown in FIG. 1B. Here, there is no actual index change in the material 7 adjacent to the waveguide core 5, but a centrally located guiding ridge 9 above the core 5 creates an effective index difference in the areas laterally adjacent the guiding core 5. Such weakly guided waveguides 3 are also known as shallow ridge waveguides, and may have an index contrast Ng—Nc of <0.05.

Low-cost, small-size, and high-performance InP-based Mach-Zehnder modulators (MZMs) are widely known in the photonic components industry. In general, it is desirable that such modulators use strongly-guided waveguides, like those in FIG. 1A, with a dielectric cladding 7. Not only do strongly-guided waveguides enable small size through the compact routing of waveguides, they confine the mode to the central portion 5 of the waveguide 3 that provides the optical modulation function, thereby enabling high efficiency.

Modulators of the sort described herein typically mix a Continuous Wave (CW) optical carrier input, having no data content, with a broadband electrical signal that carries data. The frequency of the CW carrier may be, for example, approximately 193 THz and is typically desired to be as narrowband as possible, for example 100 kHz line width. The bandwidth of the electrical data signal may span, for example, from 500 MHz to 10 GHz, or from 500 MHz to 70 GHz in modern high-capacity telecommunications systems. Depending on the modulation format being used, the bandwidth can provide a data rate of 10 Gbit/s to 400 Gbit/s or more. The data is transmitted as an optical carrier wave at the frequency of the original CW optical carrier input, with a modulation envelope determined by the electrical data signal. The modulators, therefore, perform an up-conversion function from original Radio Frequency (RF) data baseband to optical frequencies, in order to enable transmission through optical fiber. The modulators often further combine several RF data tributaries that are in an amplitude-modulated format into a more complex combined phase-and-amplitude-modulated format that may give advantages, for example, in the Signal to Noise Ratio (SNR) of the data at the receiving end of the fiber.

Critical to the function of such modulators is the CW optical carrier input. In some applications, the CW optical carrier is provided by an external laser that is coupled through a short length of optical fiber to the modulator input if they are packaged separately, or through a micro-lens or optical guiding system if they are co-packaged. In these applications, the light lost during the coupling and modulation processes is an important performance parameter. If too much of the CW optical carrier light is lost, the up-converted data signal emitted from the modulator will have low power, and is subject to a poor SNR at the receiver. One obvious solution is to use a high-power laser to compensate the losses. However, there are technology limitations to how high the laser power can be, and engineering consequences in terms of power dissipation, performance non-idealities, and cost. Monolithically integrating a Semiconductor Optical Amplifier (SOA) with the modulator can overcome these problems.

In other applications, it is preferable to monolithically integrate the laser itself with the modulator, thereby avoiding optical coupling losses, packaging complexity, and cost associated with an external solution. Of course, laser integration could also be combined with an integrated SOA to further boost the optical output power. Lasers and SOAs can be referred to generally as active or gain elements. Whether it is a laser or SOA, the state of the art in lateral optical guiding means is essentially similar. Often with such integration comes the need to integrate photonic components other than a modulator, laser, or SOA: detectors, optical monitors, phase tuning elements, variable optical attenuators, and so on. The extension of this invention to the integration of a gain element (laser or SOA) with photonic components other than a modulator is thus fundamentally important.

Known shallow ridge, or stripe, lasers and SOAs have a configuration similar to FIG. 1B. In addition to being weakly guided, they lack lateral current confinement capability, such that current spreads non-uniformly and inefficiently over a large area, thereby reducing gain.

Known plain deep ridge lasers and SOAs, similar to FIG. 1A, with a lateral cladding 7 of dielectric, as in most modulators, are almost never used, as the etched sidewall of the guiding core 5 leaves dangling chemical bonds that act as mid-level traps. These mid-level traps add a significant non-radiative component to the associated carrier recombination, making the current-gain curve highly unfavorable. Properly preparing the sidewall with chemical treatment and overgrowing it with semiconductor can remove these dangling chemical bonds.

Known Buried Heterostructure (BH) laser and SOA structures come in numerous variants and represent the current industry standard, utilizing a more sophisticated arrangement of current-blocking layers to achieve better current confinement to the Multi-Quantum Well (MQW) core. One shortcoming is the complex regrowth recipe that is difficult to monolithically integrate with a modulator in a manufacturable manner. Further, BH lasers and SOAs with Al-containing cores are notorious for their questionable reliability. As illustrated in FIG. 2A, the BH structure 15 is manufactured by blanketing the N—InP wafer 10 with a first growth of MQW material 12. A selective etch is then performed to form a MQW ridge. Subsequently, a multi-layer stack 16 is selectively grown around the MQW ridge on the N—InP wafer 10, with sensitive critical dimensions. Finally, an overgrowth of P-type semiconductor 18 is blanketed over the MQW ridge and multi-layer stack 16. Although the current is much better confined, the waveguide is still weakly guided.

Recently, an attempt has been made to simplify the complex arrangement of current-blocking layers of the BH laser by using a self-aligned single-growth technique. The structure exhibits beneficial current confinement. As illustrated in FIG. 2B, the simplified BH structure 15b is manufactured by blanketing the N—InP wafer 10 with a first growth of MQW 12 and P-type semiconductor 18 material. A selective etch is performed to form an MQW ridge. Subsequently, a single, blanket layer of undoped InP 17 is grown over the structure 15. The undoped InP 17 is removed from the ridge top using a self-aligned etch technique. Like the more complex BH structure 15a (FIG. 2A), this simplified BH structure 15b (FIG. 2B) has good current confinement but is still weakly guided.

Neither the shallow ridge structure (FIG. 1B) nor the BH structure (FIG. 2B) can be directly optically coupled to a modulator because the waveguides are incompatible. Some interconnection means is necessary to bridge the strongly guided and weakly guided waveguides, such as that provided in U.S. Pat. No. 7,184,207, for example.

Thus, what are still needed in the art are structures and processes that enable reliable, manufacturable modulators monolithically integrated with lasers and optical amplifiers having well confined current injection Additionally, Selective Area Epitaxy (SAE) includes the local growth of an epitaxial layer through a patterned amorphous dielectric mask (typically Silicon Dioxide ($SiO_2$) or Silicon Nitride ($Si_3N_4$)) deposited on a semiconductor wafer. Semiconductor growth conditions are selected to ensure epitaxial growth on the exposed wafer, but not on the dielectric mask. SAE formed by covering parts of a semiconductor surface with a mask material on which growth does not occur. Traditionally SAE is used to intentionally enhance the growth of epitaxial layers. The larger the area of the masked region the greater the increase in the rate of growth of the crystal adjacent to the mask. The degree of growth enhancement depends on many factors including, growth temperature, growth pressure, mask composition, mask area, and mask orientation.

Unintentional growth enhancement at a mask edge is an ongoing problem in SAE. Solutions to date focus on altering the growth conditions for the epitaxial growth. Of note, SAE is a technique that is used in InP photonics production. An example of such optical modulators is described in U.S. Pat. No. 9,182,546 B2, entitled "Monolithic Optoelectronic TWE-component Structure for High Frequencies and Low Optical Insertion Loss," the contents of which are incorporated by reference herein in their entirety.

Suppressing unintentional enhancement by changing growth conditions has the disadvantage of also suppressing the intentional growth enhancement, which is often the purpose of pursuing SAE growth in the first place. The traditional use of straight-sided SAE masks leads to linear structures of enhanced growth material along the mask edge that is fragile and breaks off to form contamination of the device surface, which has an adverse effect on manufacturability and reliability.

BRIEF SUMMARY OF THE DISCLOSURE

The present disclosure relates to systems and methods for a semiconductor device with Selective Area Epitaxy (SAE) growth utilizing a mask to suppress or enhance growth at the edges. Again, SAE is a technique for crystal growth on semiconductor wafers. Areas of the wafer are covered or masked by thin layers of dielectric material (e.g., $SiO_2$, $Si_3N_4$, etc.). In a crystal growth reactor, such as a Metal-Organic, Chemical-Vapor Deposition (MOCVD) chamber, crystal growth proceeds selectively only on those areas not covered by the mask. This disclosure provides a process for producing a semiconductor device containing areas of selective growth in an arbitrary orientation without unwanted growth enhancement and corresponding defects at the exterior edges of the masked areas. Specifically, the process includes variable profiles on the mask edges that can be used to suppress or enhance growth at the edges.

Also, the present disclosure provides a design whereby an optical amplifier is efficiently monolithically integrated with a deeply-etched ridge waveguide modulator, and, in particular, a multi-growth modulator formed on an InP wafer, such as that provided in U.S. Pat. No. 9,182,546, for example. The design enables the re-use of existing undoped overgrowth in the TWE modulator for the purpose of current blocking. Subsequent deep etching of the current-blocked buried ridge provides for independent control of the confinement factor and enables efficient coupling to a deeply-etched modulator. Thus, the present disclosure provides a means to re-use an overgrowth that already exists in the standard modulator process sequence, thereby reducing cost, complexity, and problems associated with many epitaxial growths, such as reliability issues. The present disclosure provides better current confinement, and therefore better electrical efficiency, than alternative shallow ridge solutions. The present disclosure decouples current confinement (provided by i-InP blocks described in greater detail herein below) from optical confinement (provided by etched areas described in greater detail herein below). Accordingly, the present disclosure provides an efficient alternative means to couple light from the modulator to the gain section without introducing an additional or new optical element into the design, such as that provided in U.S. Pat. No. 7,184,207, for example.

The present disclosure provides a modulator with an optical amplifier, including: an N-type layer; a multi-quantum well material disposed on the N-type layer; a P-type layer disposed on the multi-quantum well material opposite the N-type layer; wherein a portion of the N-type layer, the multi-quantum well material, and a portion of the P-type layer collectively form a ridge structure; and a material that is not intentionally doped (commonly referred to as intrinsic, i-type) disposed on the N-type layer and about side portions of the ridge structure using selective area epitaxy. Note that although the common nomenclature for semiconductor that is not intentionally doped is i-type, it is understood by those skilled in the art that a low level of unintentional trace dopant contamination may exist in i-type material, sometimes up to concentrations of 1e16 atoms/cm$^3$ or more, although lower concentrations are typically desired. Optionally, the i-type material is further deeply etched to form a strongly guided structure. The N-type layer includes N—InP. The P-type layer includes one of P—InGaAs and P—InP. The i-type material includes i-InP, but may alternatively be any type of suitable current-blocking material that impedes current flow, such as semi-insulating iron-doped InP. Optionally, over all or some portion of the length, a width of the strongly guided structure is selected to couple efficiently to a strongly guided modulator waveguide.

BRIEF DESCRIPTION OF THE DRAWINGS

The present disclosure is illustrated and described herein with reference to the various drawings, in which like reference numbers are used to denote like system components/method steps, as appropriate, and in which:

FIGS. 9A-9D are block diagrams illustrating steps in an SAE growth process on a wafer to illustrate excess growth at edges of a mask;

DETAILED DESCRIPTION OF THE DISCLOSURE

Again, the present disclosure provides a design whereby an optical amplifier is efficiently monolithically integrated with a deeply-etched ridge waveguide modulator, and, in particular, a multi-growth modulator formed on an InP wafer, such as that provided in U.S. Pat. No. 9,182,546, for example. The design enables the re-use of existing undoped overgrowth in the TWE modulator for the purpose of current blocking. Subsequent deep etching of the current-blocked buried ridge provides for independent control of the confinement factor and enables efficient coupling to a deeply-etched modulator. Thus, the present disclosure provides a means to re-use an overgrowth that already exists in the standard modulator process sequence, thereby reducing cost, complexity, and problems associated with many epitaxial growths, such as reliability issues. The present disclosure provides better current confinement, and therefore better electrical efficiency, than alternative shallow ridge solutions. The present disclosure decouples current confinement (provided by i-InP blocks described in greater detail herein below) from optical confinement (provided by etched areas described in greater detail herein below). Accordingly, the present disclosure provides an efficient alternative means to couple light from the modulator to the gain section without introducing an additional or new optical element into the design, such as that provided in U.S. Pat. No. 7,184,207, for example.

In general, the present disclosure provides a modulator with an optical amplifier, including: an N-type layer; a multi-quantum well material disposed on the N-type layer; a P-type layer disposed on the multi-quantum well material opposite the N-type layer; wherein a portion of the N-type layer, the multi-quantum well material, and a portion of the P-type layer collectively form a ridge structure; and a material that is not intentionally doped (undoped, or i-type) disposed on the N-type layer and about side portions of the ridge structure using selective area epitaxy. Optionally, the i-type material is further deeply etched to form a strongly guided structure. The N-type layer includes N—InP. The P-type layer includes one of P—InGaAs and P—InP. The i-type material includes i-InP, but may alternatively be any type of suitable current-blocking material that impedes current flow, such as semi-insulating iron-doped InP. Optionally, over all or some portion of the length, a width of the strongly guided structure is selected to couple efficiently to a strongly guided modulator waveguide.

Monolithically Integrated Gain Element

Figure 1A:
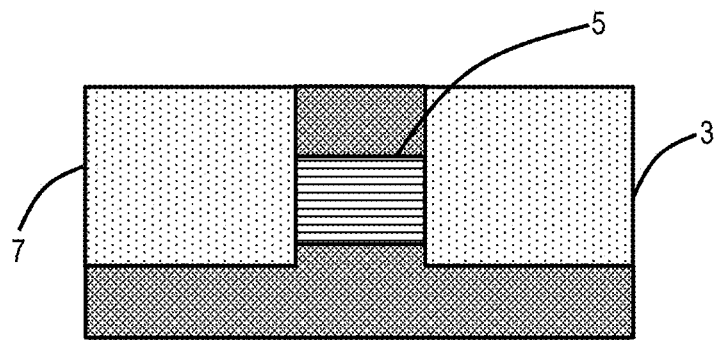
FIGS. 1A and 1B are a series of schematic diagrams illustrating conventional strongly-guided and weakly-guided (shallow ridge) waveguides, respectively.
Figure 1B:
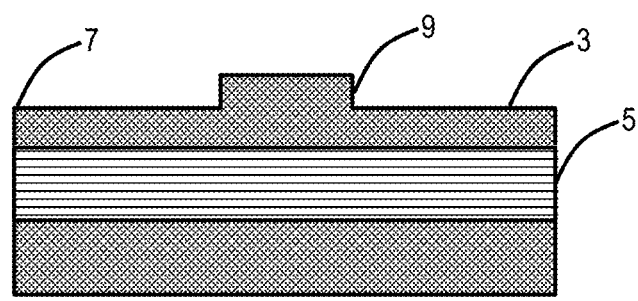
Figure 2A:
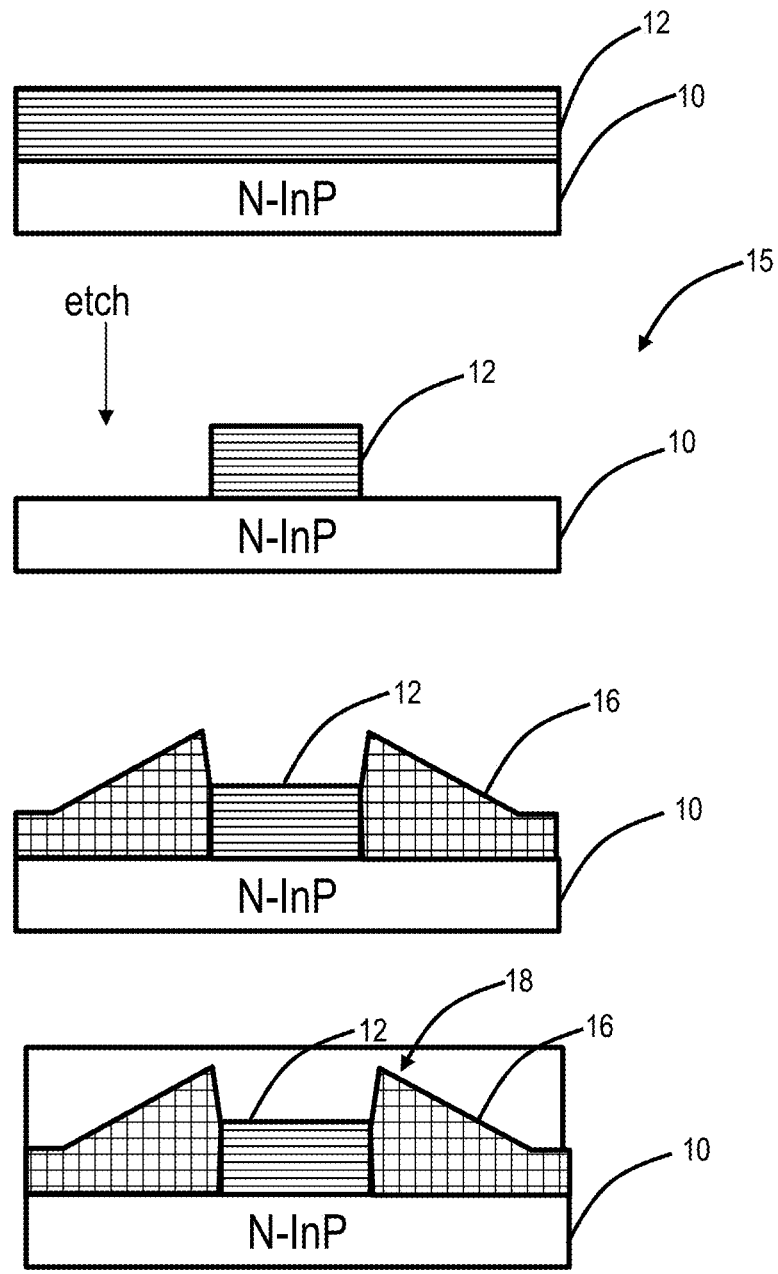
FIGS. 2A and 2B are a series of schematic diagrams illustrating the fabrication of conventional BH lasers or SOA structures.
Figure 2B:
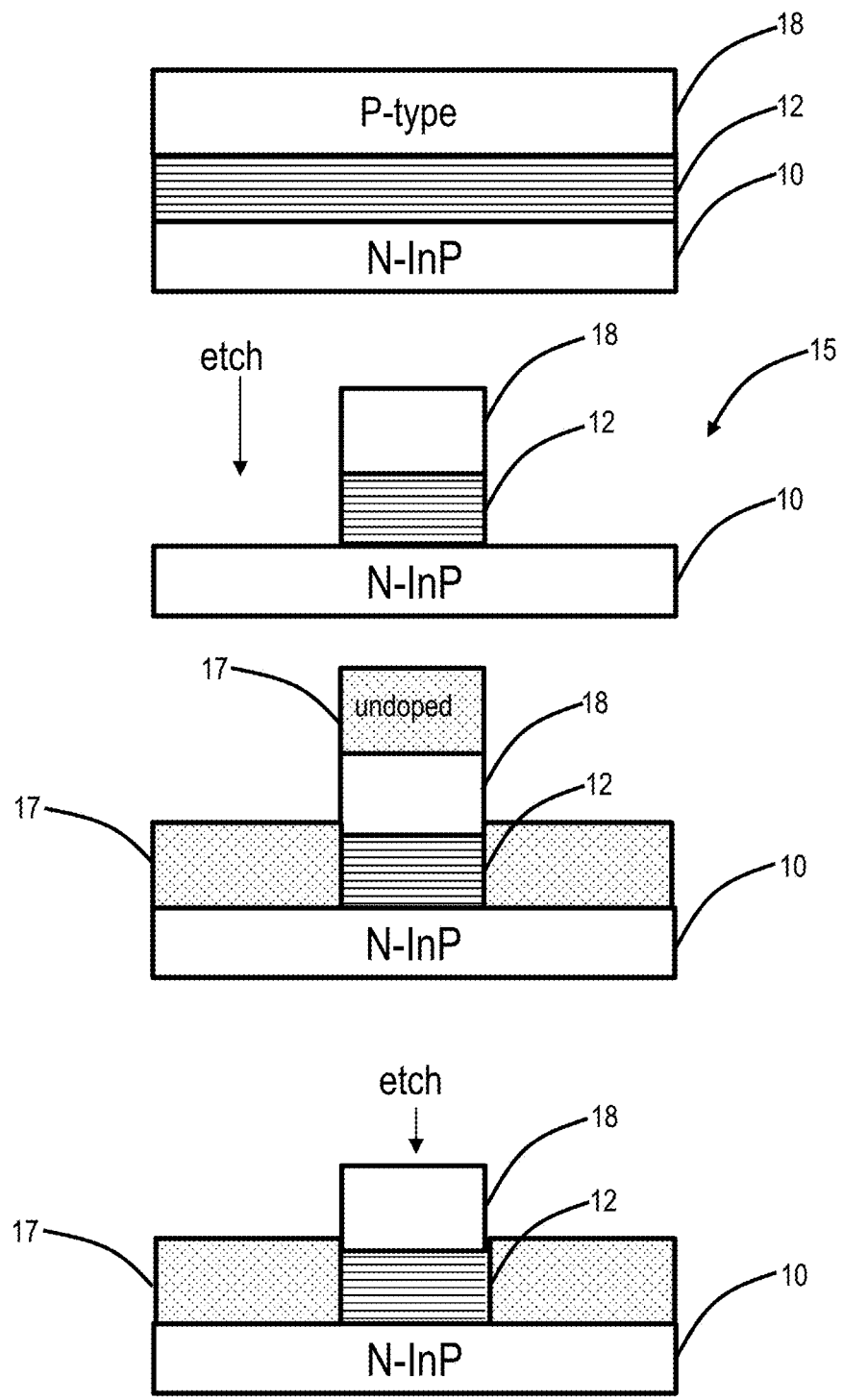
Figure 3:
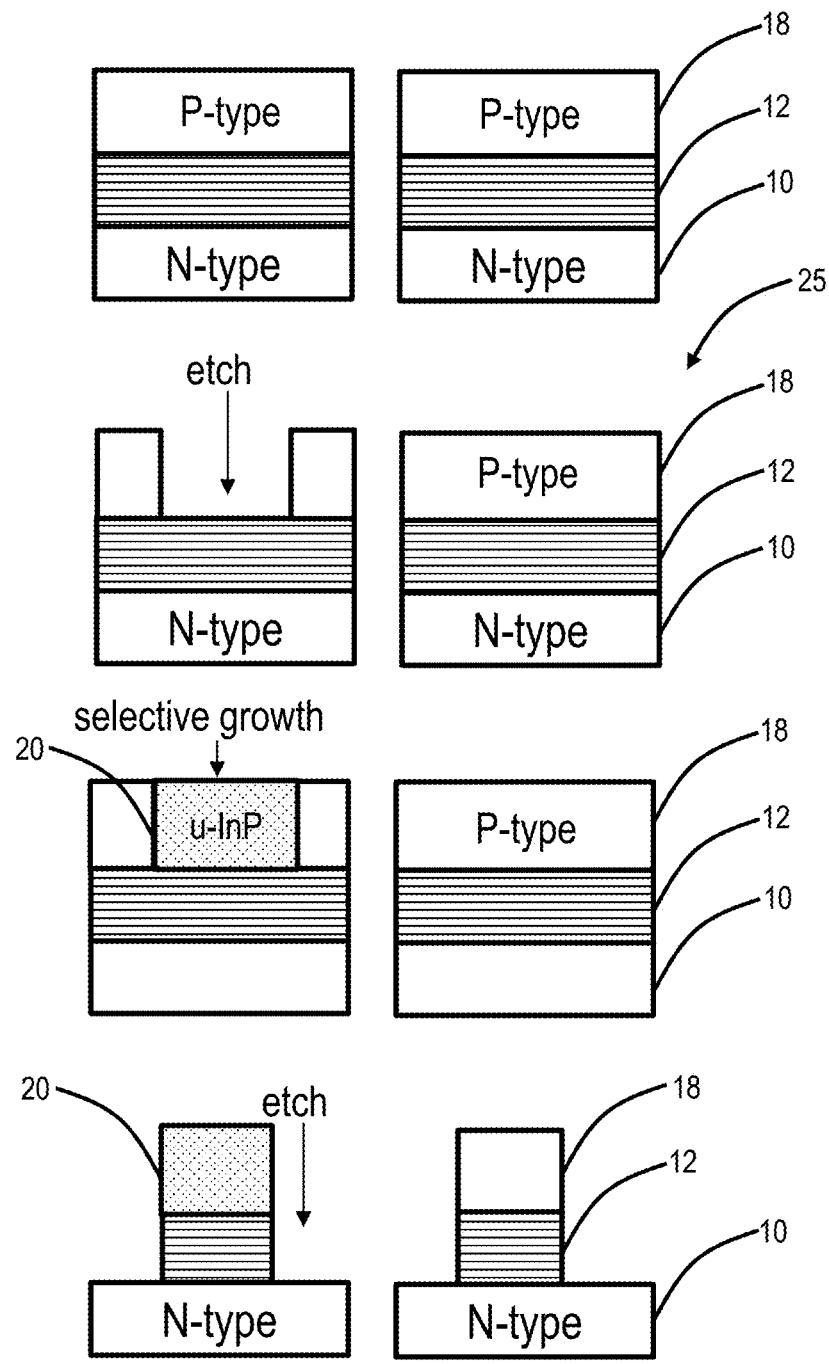
FIG. 3 is a series of schematic diagrams illustrating the fabrication of a conventional gain element.

FIG. 3 illustrates the fabrication of a conventional modulator structure 25, such as by the process provided in U.S. Pat. No. 9,182,546, for example. The modulator structure 25 is fabricated by blanketing the N-type wafer 10 with a first growth of MQW material 12 and a P-type layer 18. In a i-type ridge embodiment, a selective etch of the P-type layer 18 is then performed, and a u-InP layer 20 is selectively grown in the etched area. The P-type layer 18 and MQW material 12 are then selectively etched, leaving a i-InP-capped ridge in the i-type ridge SOA embodiment and a P-type-capped ridge in a P-type ridge modulator embodiment. Thus, a selective i-type growth step is typically utilized. It is still desirable to monolithically integrate a SOA with a modulator and provide performance that approximates that of a BH structure 15 (FIGS. 2A and 2B), without the introduction of a critically-aligned growth step. It is also still desirable to, for the monolithically integrated SOA, create a BH-like structure that has a lateral optical mode that is compatible for optical coupling to a deeply etched modulator ridge.

Figure 4:
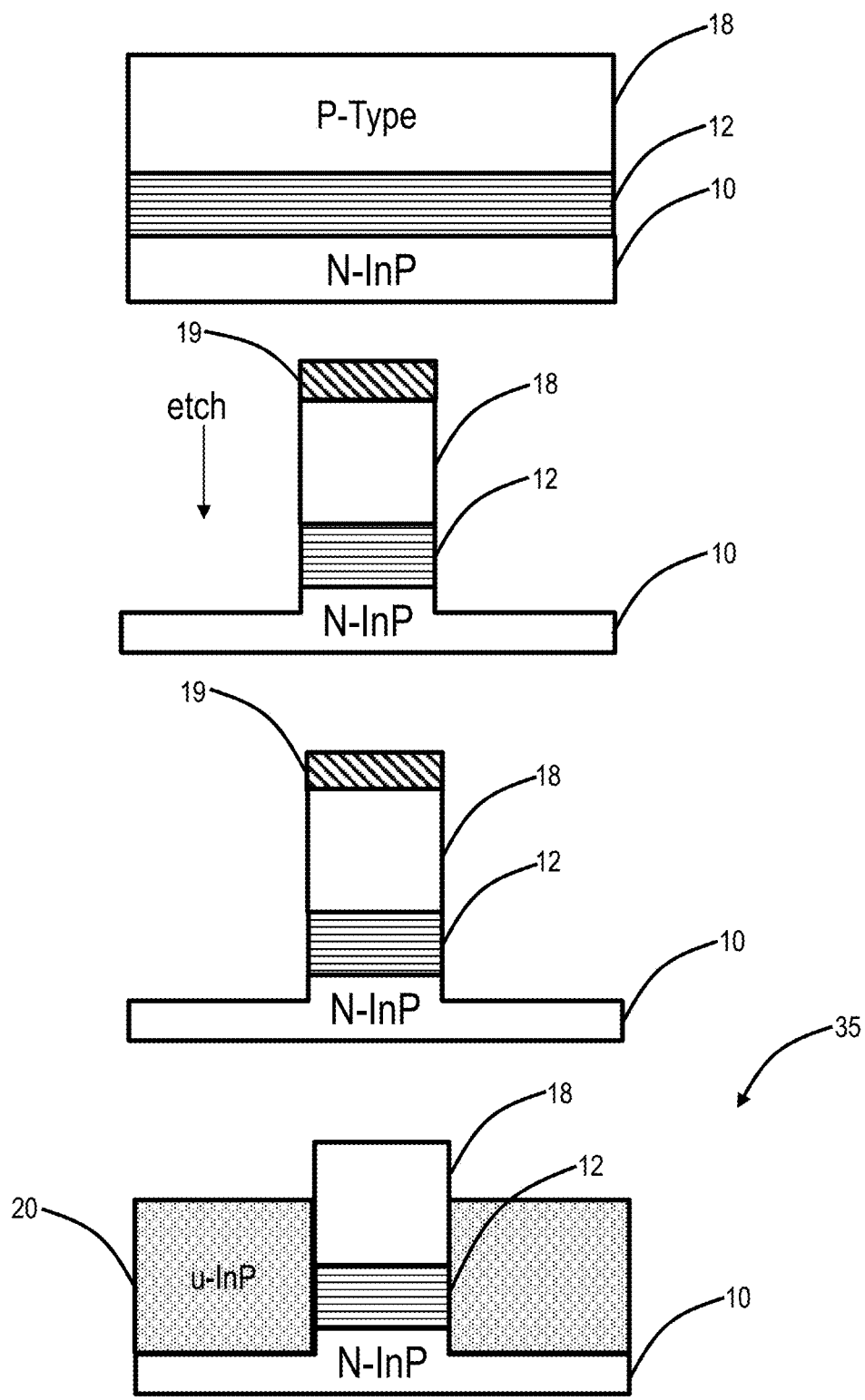
FIG. 4 is a series of schematic diagrams illustrating the fabrication of one exemplary embodiment of the gain element of the present disclosure.
Figure 5:
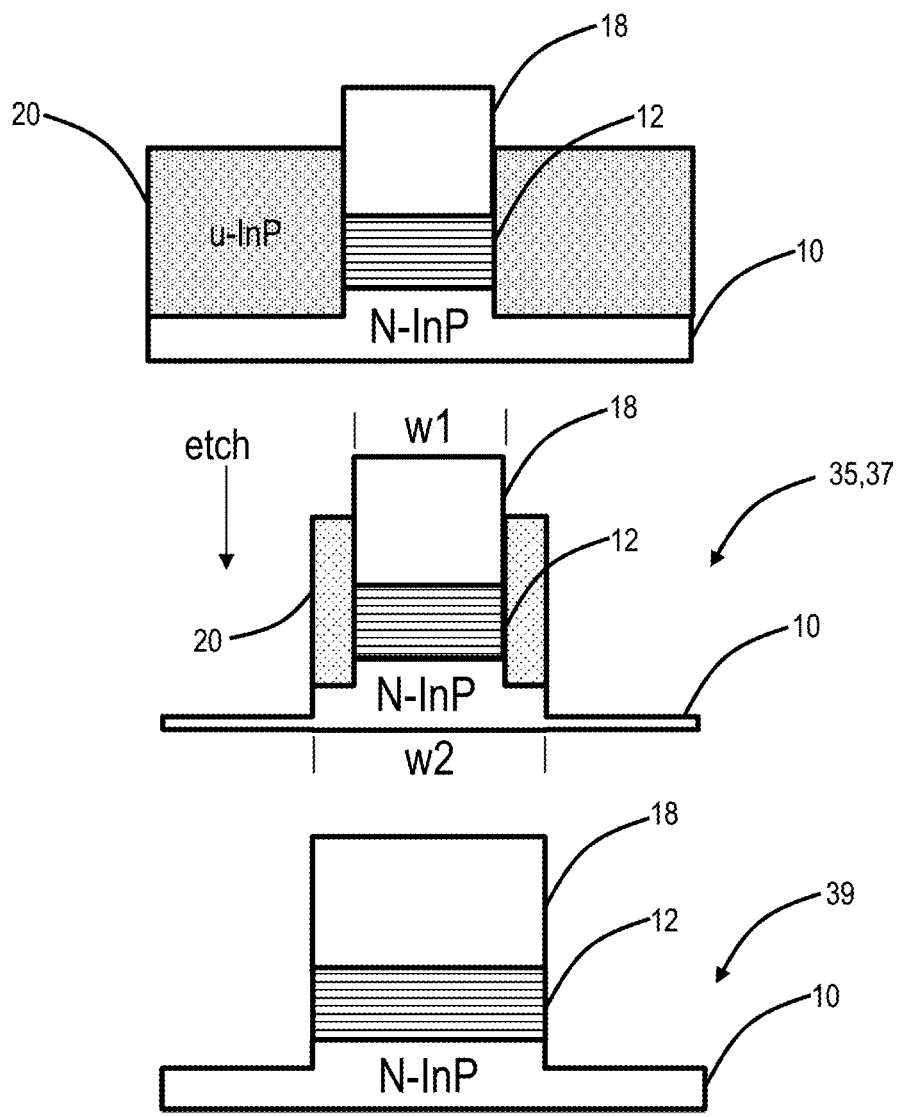
FIG. 5 is a series of schematic diagrams illustrating the fabrication of another exemplary embodiment of the gain element of the present disclosure, as well as the coupling of the associated SOA and modulator.

Referring now specifically to FIG. 4, in an embodiment, the gain element structure 35 of the present disclosure is fabricated by blanketing an N-type layer 10 with a first growth of optical gain material 12 and a P-type layer 18. The P-type layer 18, optical gain material 12, and N-type layer 10 are then selectively etched, leaving a P-capped ridge that is covered with a mask 19. An i-type growth step is then utilized to fill the lateral areas of the ridge with i-InP material 20. Here, the lateral i-InP material 20 provides superior current blocking, without the extra growth steps and critical alignments associated with BH fabrication FIG. 5 is a series of schematic diagrams illustrating the fabrication of another exemplary embodiment of the gain element structure 35 of the present disclosure, as well as the means for coupling of the associated SOA 37 and modulator 39. The i-InP material 20 and N-type material 10 are etched to form i-InP material walls on either side of the ridge, thereby providing strong guiding on either side of the ridge. Further, the deeply etched modulator waveguide can be widened to provide lateral optical matching. It will be appreciated that, in FIG. 5, the bottom schematic represents the modulator waveguide that has been width-matched to the SOA input/output waveguide, shown in the middle schematic. For the SOA 37, W1 (current confinement) and W2 (optical mode overlap) can be varied independently, allowing the gain to be varied along the length of the SOA 37, for example to mitigate the effects of spatial hole burning.

Figure 6:
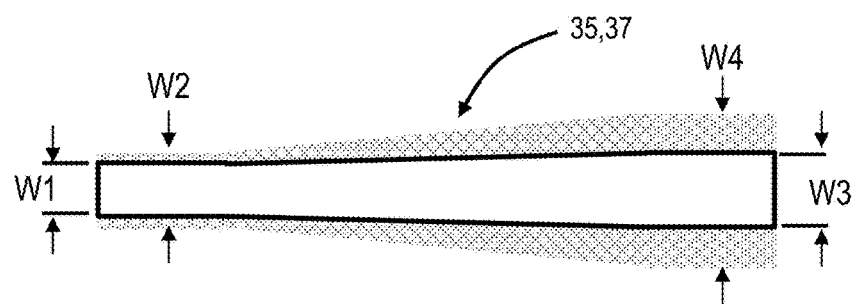
FIG. 6 is a schematic diagram illustrating the flaring of a waveguide SOA or modulator width to match an associated modulator SOA optical mode in accordance with the methods of the present disclosure.

FIG. 6 is a schematic diagram illustrating the flaring of a waveguide SOA or modulator width to match an associated modulator SOA optical mode in accordance with the methods of the present disclosure. Any arbitrary combination of central width and exterior width, with tapers in between, is possible. For example, only the central portion could be tapered, omitting the leading and trailing constant sections. This provides practical advantages for spatial hole burning by having high optical confinement at the beginning, and increasing injection, but lowering optical overlap at the end.

Figure 7:
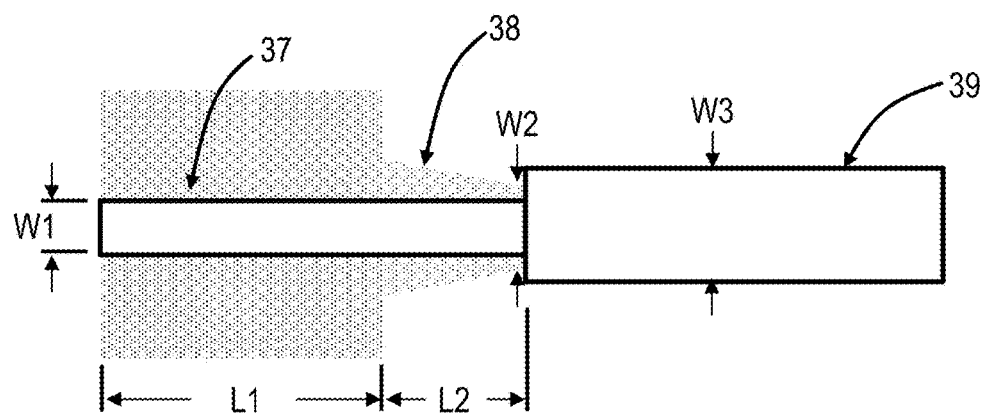
FIG. 7 is another schematic diagram illustrating the flaring of a waveguide modulator width to match an SOA optical mode in accordance with the methods of the present disclosure.

FIG. 7 is another schematic diagram illustrating the flaring of the waveguide modulator width to match the SOA optical mode in accordance with the methods of the present disclosure. Here, the SOA waveguide 37 is coupled to the modulator waveguide 39 via a tapering passive waveguide 38 or a tapering portion of the SOA waveguide 37 or modulator waveguide 39.

In the conventional modulator structure 25 of FIG. 3, there is already a selective growth of i-InP layer 20, the thickness of which may be determined by the optimization of the modulator design. This same growth is used herein to provide better current blocking for a SOA. As shown in FIG. 4, the i-InP layer 20 from the conventional modulator may also be deposited on either side of the SOA ridge 19. The design requirements of the modulator 25, however, may not provide a thickness of i-InP layer 20 sufficient to match the height of the SOA ridge 19. To improve the manufacturability of subsequent processing steps, enhanced growth may be used to make a more planar top surface. It should be noted that, for regions not requiring the increased lateral confinement of the current-blocking mesa, width can be increased so as to improve the thermal impedance of the SOA. For increased lateral optical confinement (to match the modulator mode and/or improve SOA efficiency), the deep etch ridge can be used.

Semiconductor Device with Suppressed or Enhanced Selective Area Epitaxy (SAE) Growth Also, the present disclosure relates to systems and methods for a semiconductor device with Selective Area Epitaxy (SAE) growth utilizing a mask to suppress or enhance growth at the edges. Again, SAE is a technique for crystal growth on semiconductor surfaces. Areas of the wafer are covered or masked by thin layers of dielectric material (e.g., $SiO_2$, $Si_3N_4$, etc.). In a crystal growth reactor, such as a Metal-Organic Vapor-Phase Deposition (MOCVD) chamber, crystal growth proceeds selectively only on those areas not covered by the mask. This disclosure provides a process for producing a semiconductor device containing areas of selective growth in an arbitrary orientation without unwanted growth enhancement and corresponding defects at the exterior edges of the masked areas. Specifically, the process includes variable profiles on the mask edges that can be used to suppress or enhance growth at the edges.

Figure 8:
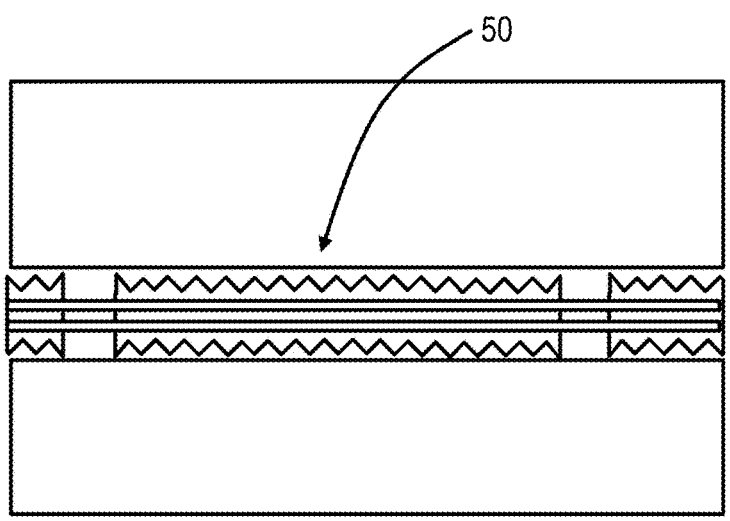
FIG. 8 is a schematic diagram illustrating a novel geometry for the edge of a mask used to overgrow an epitaxial layer in accordance with the methods of the present disclosure, suppressing undesirable growth enhancement.

By way of an enabling technology, FIG. 8 illustrates a novel geometry 50 for the edge of a mask used to overgrow an epitaxial layer. There is often an undesirable degree of enhanced crystal growth that occurs at the mask edge where the pattern is in the [011] or [0-11] directions, for example. The use of a non-linear geometry 50 for the mask edge suppresses this undesirable growth enhancement. The use of a zigzag pattern on the mask edge, rather than a straight edge, is a novel solution. Unintentional growth enhancement at a mask edge is an ongoing problem in selective area growth. Solutions to date have focused on altering the growth conditions for the epitaxial growth. Selective area epitaxy is a technique that is used in the production of many InP optical modulators. This technique and the use of mask patterns to reduce unintentional enhancement are related to multi-growth modulators on InP wafer as described in U.S. Pat. No. 9,182,546. Suppressing unintentional enhancement by changing growth conditions has the disadvantage of also suppressing the intentional growth enhancement, which is often the purpose of pursuing selective area growth in the first place. The conventional use of straight-sided selective area masks (SAMs) leads to linear structures of enhanced growth material along the mask edge that are fragile and break off to cause contamination of the device surface, which has an adverse effect on manufacturability and reliability. The use of a geometric solution 50 suppresses the intentional growth enhancement at the edge of the mask without compromising the intended growth enhancement. The effect of unintentional enhancement at a mask edge is anisotropic on the wafer surface. Along one directional axis, the effect is strong, but along the perpendicular axis it is weak. By placing a zigzag pattern 50 along the edge susceptible to enhancement, almost none of that boundary is parallel to the line along which the unintentional enhancement occurs.

FIGS. 9A-9D are block diagrams illustrating steps in an SAE growth process 95 on a wafer 100 to illustrate excess growth at edges of a mask 102. The wafer 100 can be a wafer including a wafer 104, a P island 106 of Indium Phosphide (InP), and a contact layer 108 including, e.g., Indium gallium arsenide (InGaAs). The mask 102 can include SiO$_2$, and is deposited (applied) to the contact layer 108 at FIG. 9A. In FIG. 9B, a region is etched away through the mask 102, the P island 106, and the contact layer 108. In FIG. 9C, SAE growth is performed in the etched region. Note, there is no SAE growth over the mask 100. In FIG. 9D, the mask 100 is removed. FIGS. 9C and 9D include excess growth 110 at the edge of the mask 100.

Figure 10:
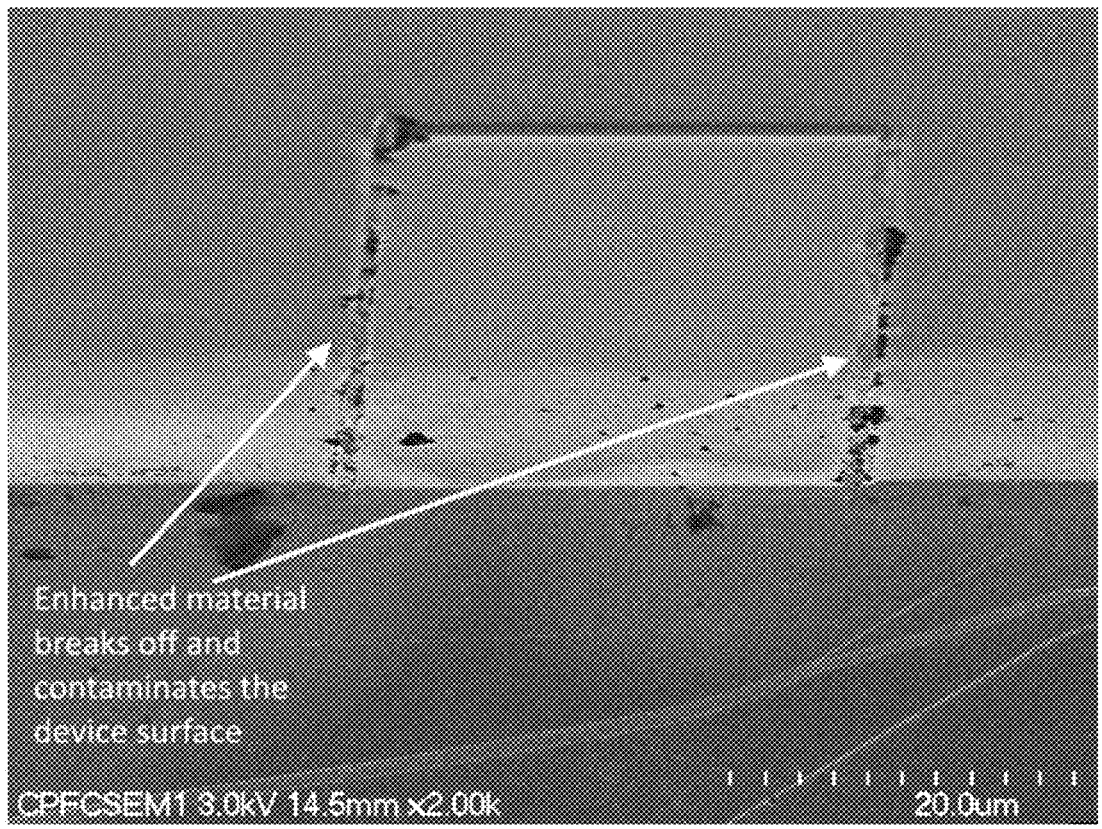
FIG. 10 is a photograph of an actual wafer after the step in FIG. 9D.

FIG. 10 is a photograph of FIG. 9D in an actual wafer 100. Specifically, this illustrates the traditional use of straight-sided SAE masks 102 that leads to linear structures of enhanced growth 110 material along the mask edge that are fragile and break off to form contamination of the device surface, which has an adverse effect on manufacturability and reliability. FIG. 10 illustrates how, in the clean-up of the residual oxide, the excess growth 110 fractures along the edge of the P island 106 parallel to the major flat, but the edge parallel to the minor flat (perpendicular to the length of the waveguides) is clean.

Figure 11A:
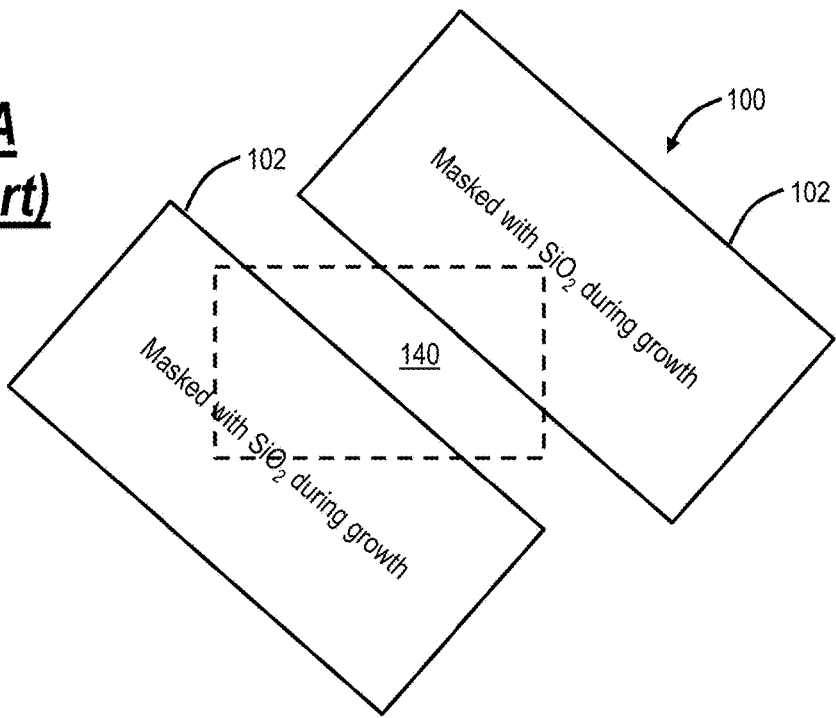
FIG. 11A is a top view of a wafer illustrating a region.
Figure 11B:
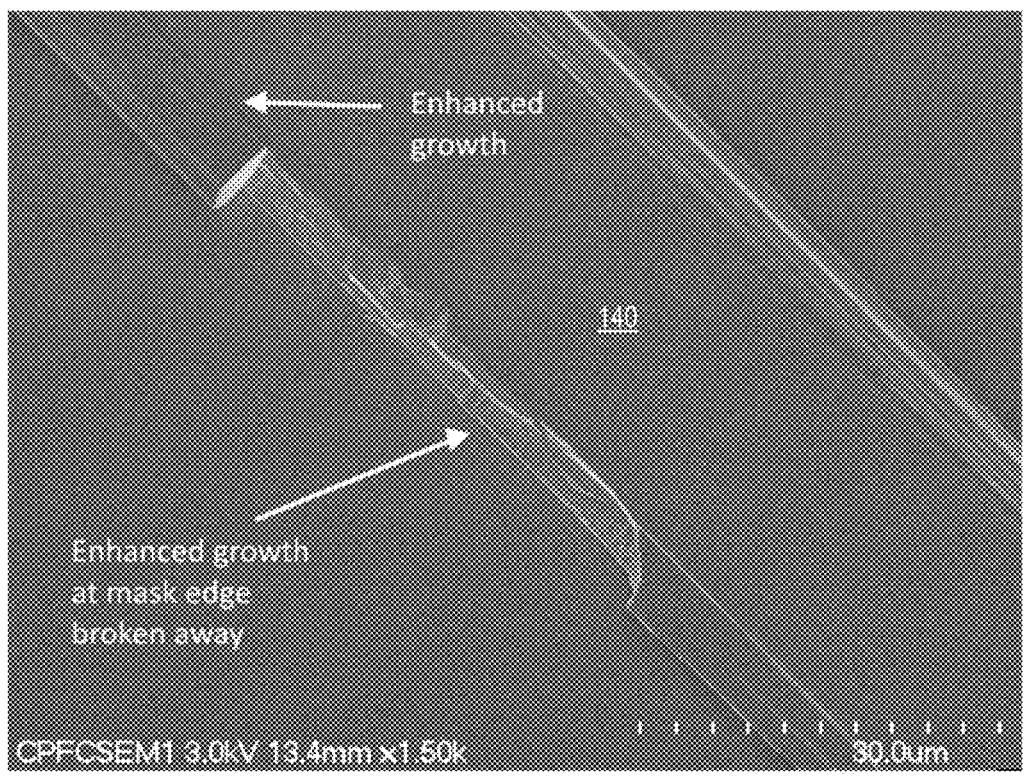
FIG. 11B is a photograph of the wafer illustrating the region and excess growth that extends over the mask.

FIG. 11A is a top view of a wafer 100 illustrating a region 140, and FIG. 11B is a photograph of the wafer 100 illustrating the region 140 and excess growth 110 that extends over the mask 102. The bare wafer is masked with oxide and has a thick overgrowth of InP in the region 140. This creates a "cap" of extra growth that overhangs the oxide. A subsequent etch is enough to remove the oxide under the cap, but it also tends to break off other material.

Figure 12A:
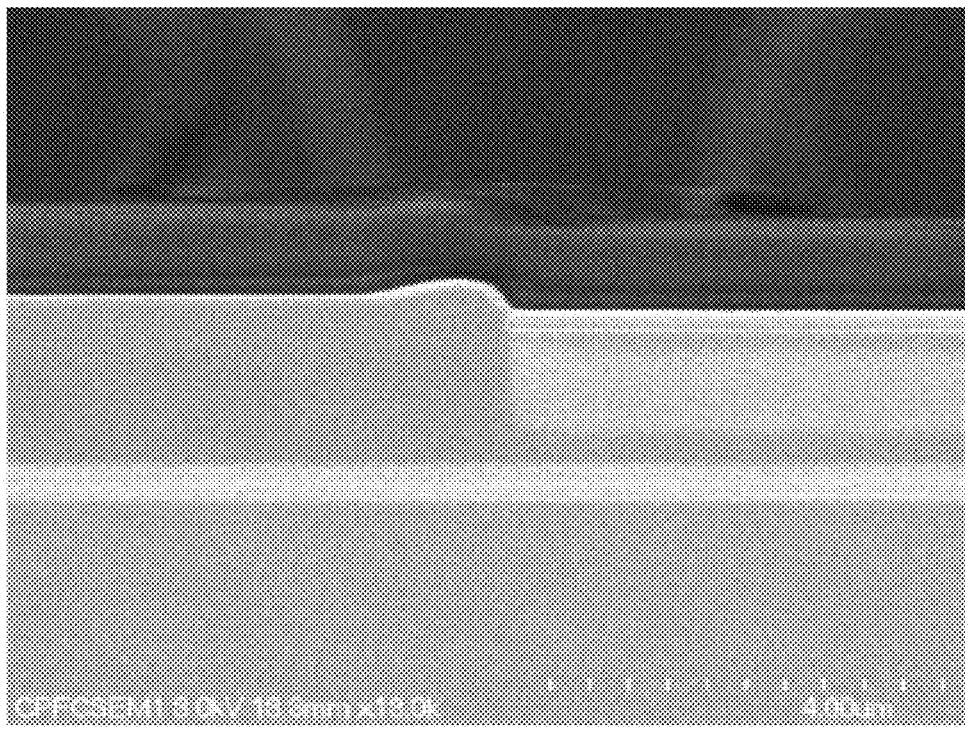
FIGS. 12A and 12B are photographs illustrating a cross-section of the P island from FIGS. 9A-9D in the direction of a waveguide (FIG. 12A) and perpendicular to the waveguide (FIG. 12B).
Figure 12B:
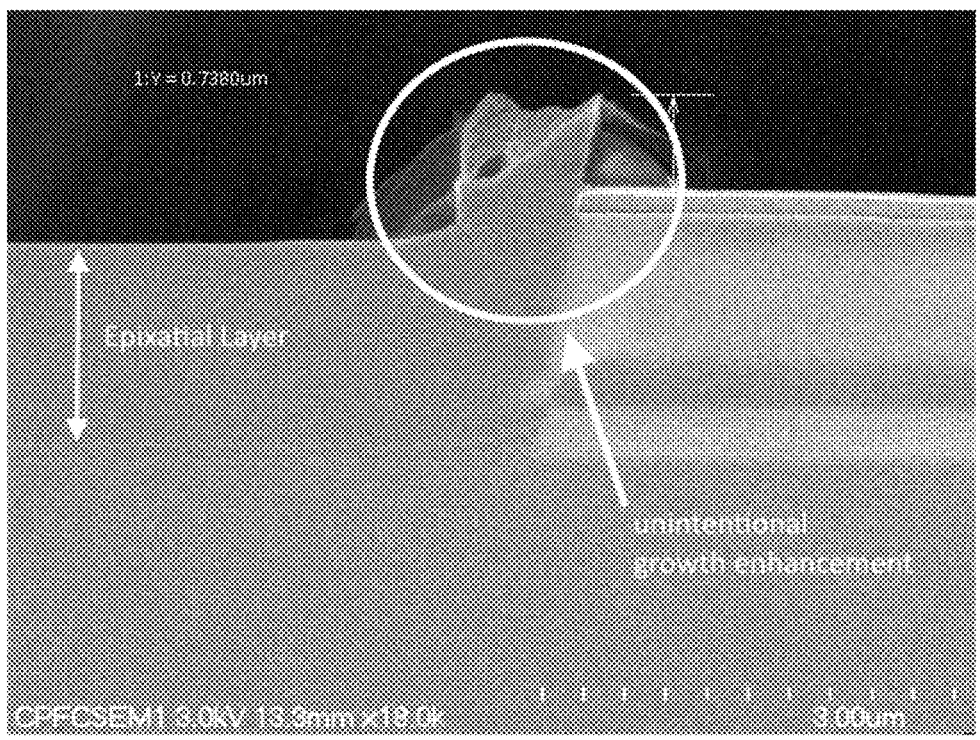

FIGS. 12A and 12B are photographs illustrating a cross-section of the P island 106 in the direction of a waveguide (FIG. 12A) and perpendicular to the waveguide (FIG. 12B). It is noted in FIG. 12A the interface is well behaved in the direction of the waveguide. FIG. 12B, on the other hand, shows the excess growth broken off after the wet clean up. Prior to this, there is a large "mushroom cap" shape of InP. This feature leaves residual columns of material when subsequently etched.

Variously, the present disclosure notes that specific, preferred angles for the mask 102, the adaptation of a shape and/or orientation of the mask 102, and/or zigzag edges of the mask 102 can lead to suppression (or enhancement) of growth at the edges of the mask 102. That is, the mask 102 includes a specific geometry that suppresses or enhances the intentional growth enhancement at the edge of the mask 102 without compromising the intended growth enhancement, which is the purpose of SAE. The effect of unintentional enhancement at a mask edge is anisotropic on the wafer surface, i.e., it has a different value when measured in a different direction. Along one directional axis, the effect is strong, but along the perpendicular axis, it is weak. This is illustrated in FIGS. 12A and 12B.

In an embodiment, by placing a zigzag pattern or other angular patterns along the edge susceptible to enhancement, almost none of that boundary is parallel to the line along which the unintentional enhancement occurs.

Through growth experiments on III-V semiconductor materials (specifically, InP wafers oriented in the (100) plane), it has been determined that mask 102 edges aligned along certain crystallographic axes exhibit an undesirable degree of enhanced crystal growth, particularly in the [011] or [0$\bar{1}$1] directions. Unfortunately for many semiconductor devices such as Photonic Integrated Circuits (PIC), these directions are the preferred primary axes of orientation. SAE masks 102, which are typically rectangular in shape, tend to be oriented along such directions to align with the device footprint and avoid wasting space. That is, conventional processes tend to orient conventional masks 102, which are rectangular with the wafer 100. The present disclosure proposes off-angled orientation as well as different geometric shapes for the masks 102, to avoid excess growth in the preferred primary axes of orientation.

Figure 13:
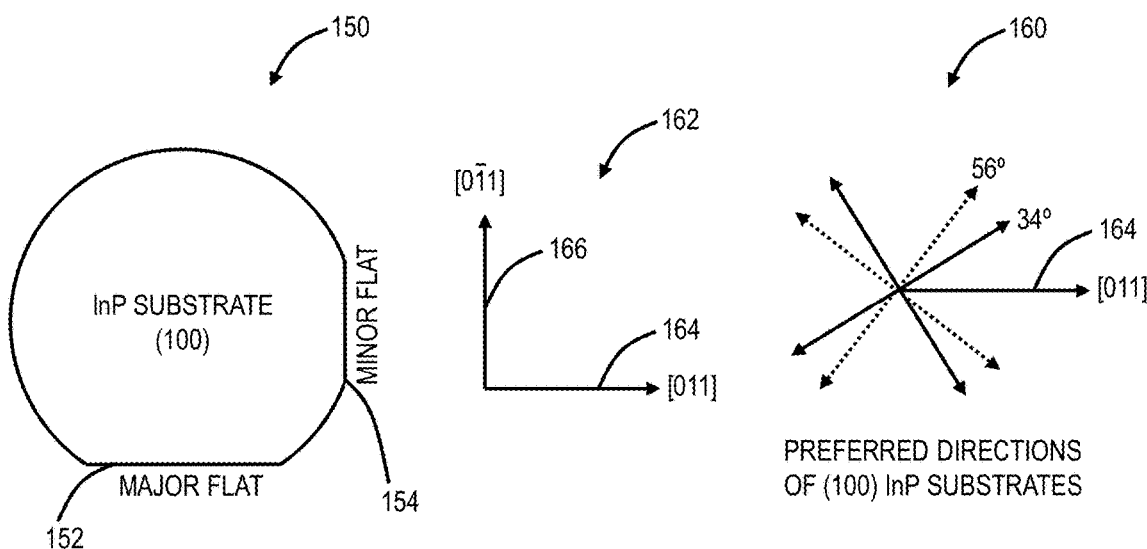
FIG. 13 is a diagram of a wafer, namely an InP wafer oriented in the (100) plane having a major flat and a minor flat perpendicular to the major flat, and a graph of preferred directions of the wafer.

Also, it has been determined that the converse of the above is also true: along specific crystallographic directions the undesirable enhanced crystal growth is suppressed and, indeed, transits through zero enhancement as a function of angle relative to the [011] or [0$\bar{1}$1] axes. FIG. 13 is a diagram of an InP wafer 150 oriented in the (100) plane having a major flat 152 and a minor flat 154 perpendicular to the major flat 152, and a graph 160 of preferred directions of the wafer 100. For orientation, a graph 162 illustrates an [011] axis 164 and a [0$\bar{1}$1] axis 166 relative to the InP wafer 510 and the flats 152, 154. Of note, the terms axis and direction may be used interchangeably herein. Also, the InP wafer 150 can be on the wafer 100. Note the locations of the major and minor flats follow one common convention but others may exist.

For InP wafers 150 oriented on the (100) plane (the wafer 100), for example, growth enhancement passes through a null when an SAE mask 102 edge is aligned with one of the angles ("preferred angles") below relative to the [011] direction 164, collected into two series.

| Series 1: |
|---|
| 34 degrees |
| 124 degrees |
| 214 degrees |
| 304 degrees |
| Series 2: |
| 56 degrees |
| 146 degrees |
| 236 degrees |
| 326 degrees |

Each series contains four angular directions, with each direction separated by 90 degrees from the other three in the series. For a (100)-oriented InP wafer 150, there are a total of eight orientations available for enhancement- and defect-free SAE mask 102 edges. Specifically, the graph 160 illustrates series 1, 2 in a graph format relative to the [011] direction 164. Note, while the angles in the series 1, 2 are specified relative to the [011] direction 164, those skilled in the art will appreciate these angles for the mask 102 edges could also be specified relative to any direction, including the [0$\bar{1}$1] direction 166, as well as other crystallographic axes not illustrated herein. Also, note, those of ordinary skill in the art will recognize these angles are approximate values.

Figure 14:
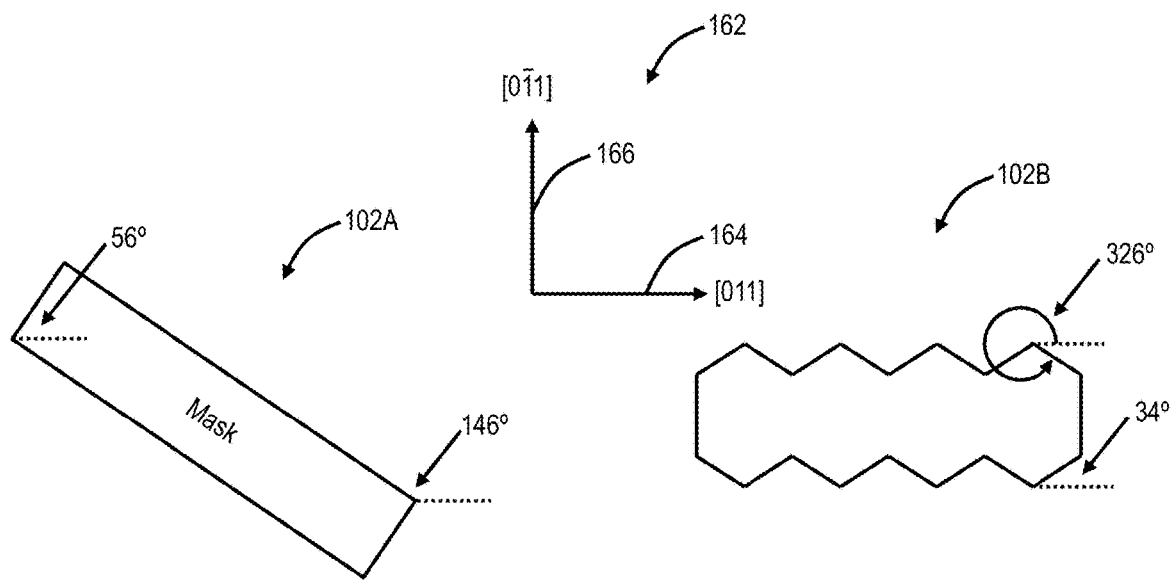
FIG. 14 is a diagram of a rectangular mask with an angled orientation according to the series 2 and a zigzag-shaped mask with variable angles from both the series 1, 2.
Figure 15:
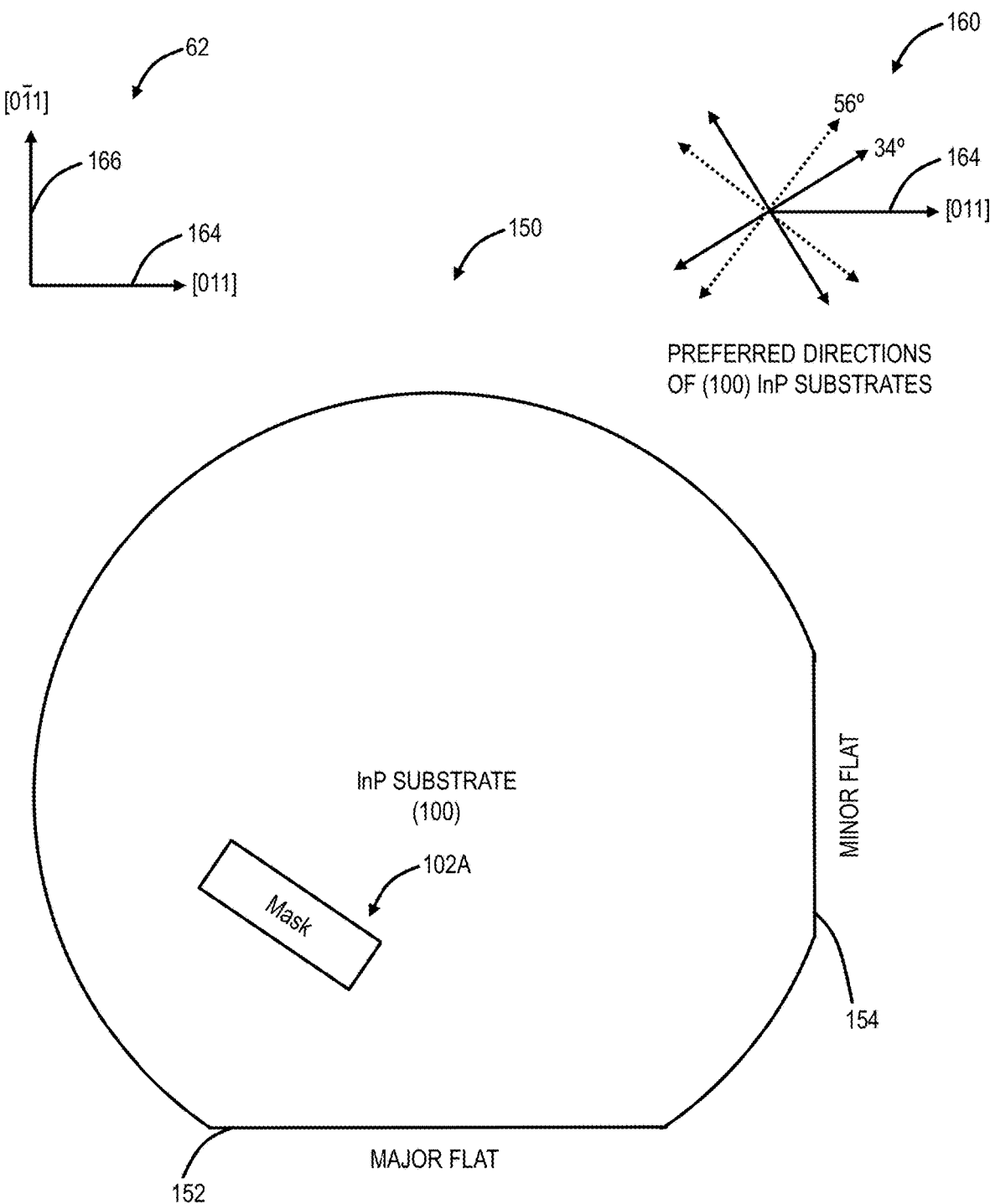
FIG. 15 is a diagram of the InP wafer with an example mask placed thereon.
Figure 16:
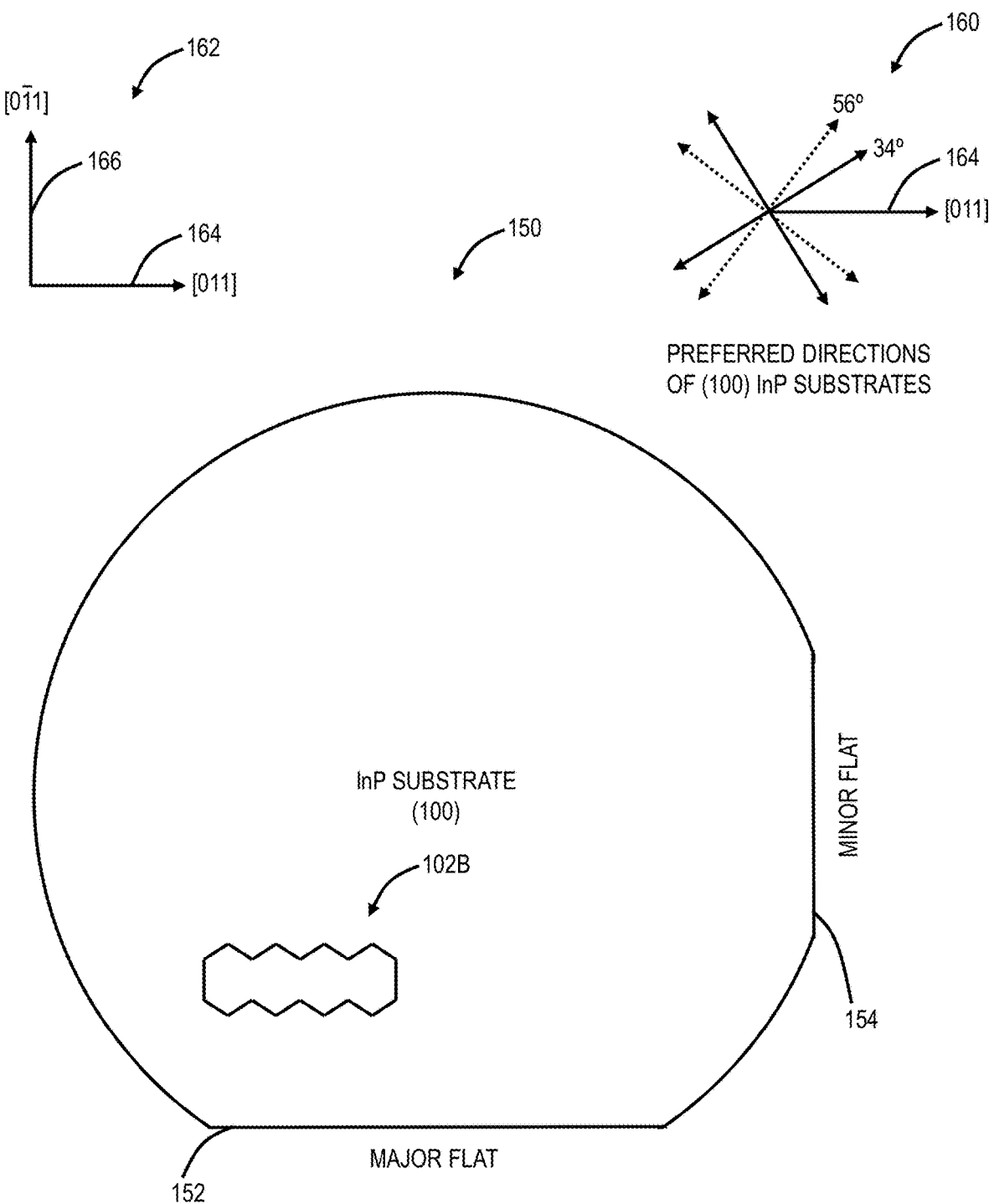
FIG. 16 is a diagram of the InP wafer with an example mask 12B placed thereon.

FIG. 14 is a diagram of a rectangular mask 102A with an angled orientation according to the series 2 and a zigzag-shaped mask 102B with variable angles from both the series 1, 2. FIG. 15 is a diagram of the InP wafer 150 with an example mask 102A placed thereon. FIG. 16 is a diagram of the InP wafer 150 with an example mask 102B placed thereon. Those of ordinary skill in the art will recognize FIGS. 13-16 are not to scale. Typically, the InP wafer 150 can be on the order of centimeters in size (diameter), from the major flat 152 to the opposite side (top). The masks 102 are sized on the order of hundreds of microns in length and tens of microns in width, with the teeth of the zig-zag on the order of microns.

The use of the mask 102 with the InP wafer 150 is utilized to form a semiconductor device with SAE, fabricated via a process of growing an epitaxial layer onto a semiconductor wafer 150. In an embodiment, the semiconductor device includes 1) a first area covered by the mask 102 which inhibits crystal growth on the semiconductor wafer 150 surface, 2) a second area, complementary (adjacent) to the first area and not covered by the mask 102, which allows crystal growth on the semiconductor wafer 150, and 3) a perimeter of the mask 102 enclosing the first area and serving as a boundary between the first area and the second area, wherein most of the length of the perimeter is substantially aligned along a preferred crystal direction that provides reduced growth enhancement on the semiconductor wafer 150.

Also, the semiconductor wafer 150 can have portions where growth enhancement is desired and portions where growth enhancement is not desired, and this disclosure provides a degree of freedom to meet both needs. For example, enhanced growth can be desired for a spot-size converter, and minimal growth can be desired for a traveling-wave electrode.

In an embodiment, the mask 102A is in the shape of a quadrilateral, namely a polygon with four edges (or sides) and four vertices or corners. That is, the perimeter can be the quadrilateral. The key is that any of the four sides fall in line with the preferred angles.

In another embodiment, the mask 102B is in the shape of a series of zigzag patterns, namely the perimeter includes a series of small corners that fall in line with the preferred angles.

The semiconductor wafer surface 150 is composed of a compound of group III and group V elements. In an embodiment, the semiconductor wafer surface 150 is InP cut near the (100) orientation. The preferred crystal direction is one or more of the following angles relative to the [011] direction, in approximate degrees: 34, 124, 214, 304, 56, 146, 236, 326. Note, each of the last four numbers is (360—one of the first four numbers) and vice versa, i.e., 326=360−34; 236=360−124, etc.

Figure 17:
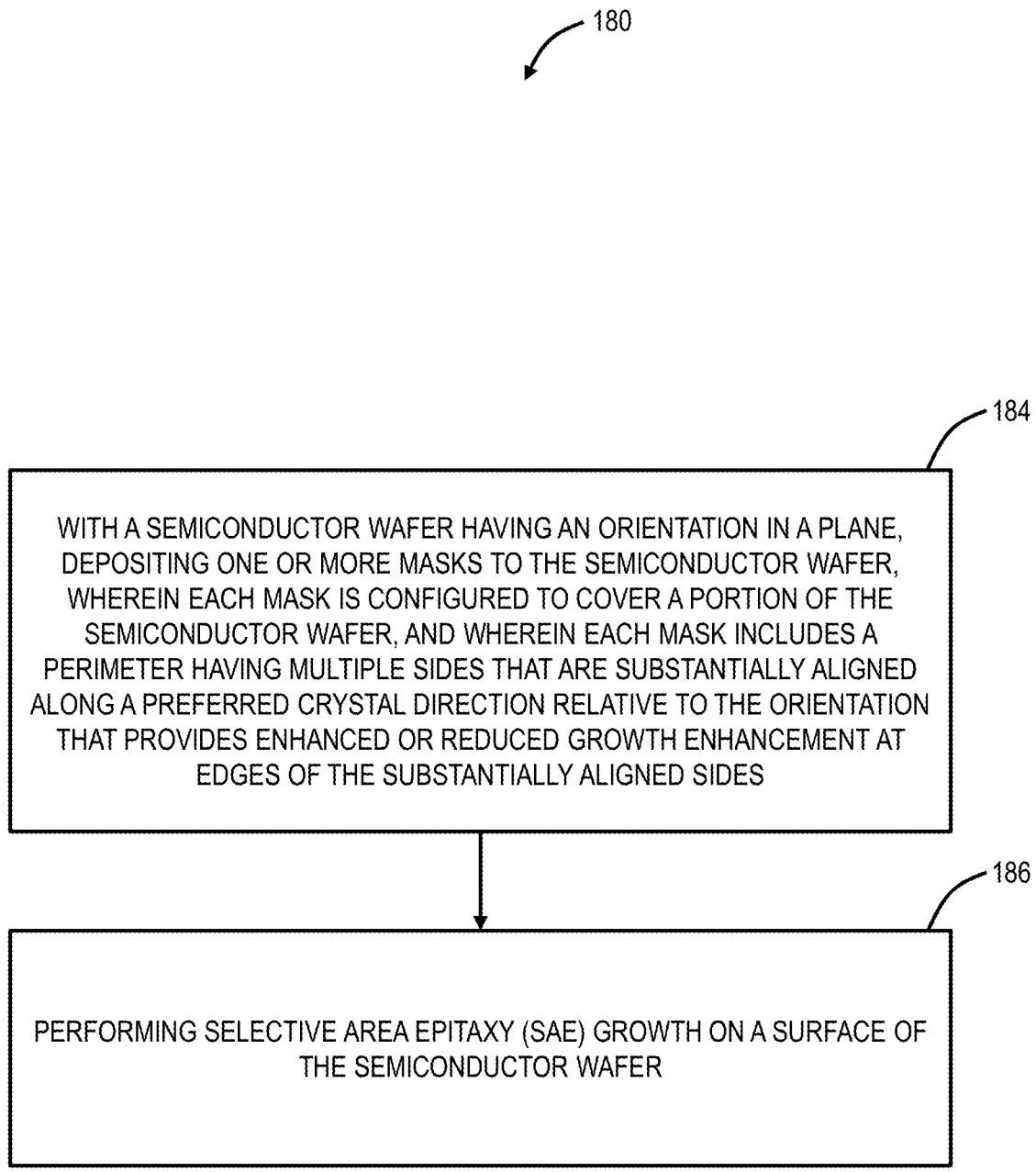
FIG. 17 is a flowchart of a process of growing an epitaxial layer onto a semiconductor wafer for a semiconductor device.

FIG. 17 is a flowchart of a process 180 of growing an epitaxial layer onto a semiconductor wafer for a semiconductor device. The process 180 includes, with a semiconductor wafer having an orientation in a plane, depositing one or more masks to the semiconductor wafer depositing one or more masks to the semiconductor wafer, wherein each mask is configured to cover a portion of the semiconductor wafer, and wherein each mask includes a perimeter having multiple sides that are substantially aligned along a preferred crystal direction relative to the orientation that provides enhanced or reduced growth enhancement at edges of the substantially aligned sides (step 184); and performing Selective Area Epitaxy (SAE) growth on a surface of the semiconductor wafer, (step 186).

The perimeter can have a shape of a quadrilateral or a series of zigzag patterns. The semiconductor wafer can include a compound of group III and group V elements. The semiconductor wafer can be Indium Phosphide (InP), and the plane can be near a (100) orientation. The preferred crystal direction can be one or more of angles having approximate degrees of 34, 124, 214, 304, 56, 146, 236, and 326, relative to a [011] direction of the semiconductor wafer.

In an embodiment, a mask is for a spot size converter, and the preferred crystal direction is selected to provide the maximum growth enhancement. In another embodiment, a mask is for a traveling-wave electrode, and the preferred crystal direction is selected to provide the reduced growth enhancement.

Also, a semiconductor device can be formed by the process 180.

In another embodiment, a semiconductor device, for fabrication via a process of growing an epitaxial layer onto a semiconductor wafer via Selective Area Epitaxy (SAE), includes a first area covered by a mask which inhibits crystal growth on a surface of the first area; a second area, adjacent to the first area and not covered by a mask, which allows crystal growth on a surface of the second area; and a perimeter of the mask serving as a boundary between the first area and the second area, wherein multiple sides of the perimeter are substantially aligned along a preferred crystal direction relative to an orientation of the semiconductor wafer, to minimize or maximize growth enhancement at edges of the substantially aligned sides.

Figure 18:
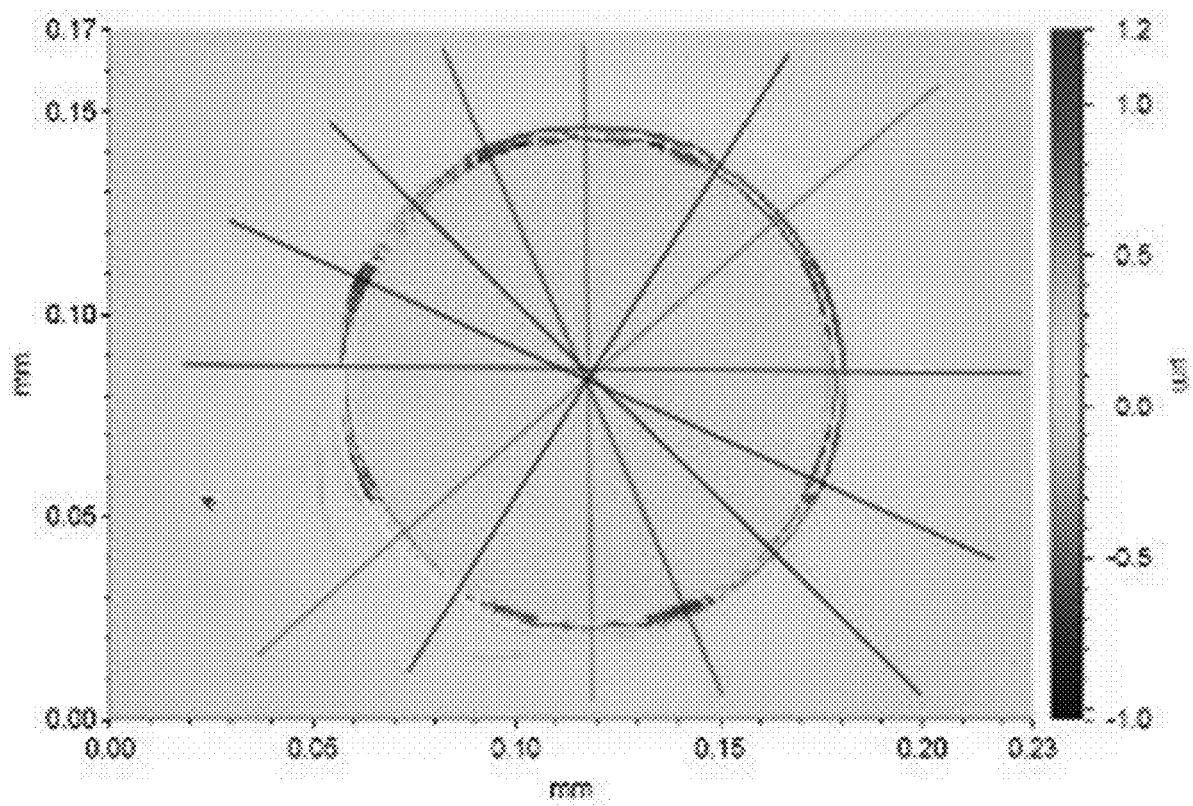
FIG. 18 is a photograph of a circular mask within a high-resolution Field of View (FOV), to illustrate how the preferred angles were determined.

FIG. 18 is a photograph of a circular mask within a high-resolution Field of View (FOV), to illustrate how the preferred angles were determined. Of note, the circular mask represents all possible angle values (0 to 360 degrees) relative to the [011] direction 164. With this approach, it was possible to isolate small islands and extract data. It was determined that it is possible to correlate the island height and volume in relation to the angle. In this manner, it was determined that the preferred crystal direction is one or more of the following angles relative to the [011] direction of the InP wafer 150, in approximate degrees: 34, 124, 214, 304, 56, 146, 236, 326. Those skilled in the art will recognize this same approach, namely using a circular mask to experimentally determine growth properties at different angles, could be used on other types of wafers 100, with other crystallographic axes, etc. to determine preferred mask 102 angles.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method comprising:
    with a semiconductor wafer having an orientation in a plane, depositing a mask to the semiconductor wafer, wherein the mask is configured to cover a portion of the semiconductor wafer, and wherein the mask includes a perimeter having multiple sides such that most of the perimeter of the mask is substantially aligned along a preferred crystal direction relative to the orientation selected from approximately 34, 56, 124, 146, 214, 236, 304, or 326 degrees relative to a [011] crystallographic axis of the semiconductor wafer to specifically reduce growth enhancement at edges of the substantially aligned sides, wherein the preferred crystal direction is determined by forming circular mask islands at varying angular orientations relative to the [011] direction, measuring island heights and volumes resulting from Selective Area Epitaxy (SAE) growth, and correlating measured island heights and volumes to the angular orientations to identify angles providing reduced growth enhancement; and
    performing Selective Area Epitaxy (SAE) growth on a surface of the semiconductor wafer.

2. The method of claim 1, wherein the perimeter has a shape of a quadrilateral.

3. The method of claim 1, wherein the surface includes a compound of group III and group V elements.

4. The method of claim 3, wherein the surface is Indium Phosphide (InP) and the plane is near a (100) orientation.

5. The method of claim 1, wherein the mask is for a traveling-wave electrode and the preferred crystal direction is selected to provide the reduced growth enhancement.

6. The method of claim 1, wherein the multiple sides are all connected to one another thereby forming a single shape for the mask.

7. The method of claim 1, wherein the mask is a single shape without needing a second mask or shape for the reduced growth enhancement.

8. The method of claim 1, wherein the multiple sides include a specific geometry that suppresses intentional growth enhancement at the edges without compromising intended growth enhancement during the SAE.

9. The method of claim 1, wherein the semiconductor wafer includes an optical device having a structure substantially free of growth-induced defects at interfaces formed by the SAE.

10. The method of claim 1, wherein the multiple sides are arranged in a non-linear geometry comprise a series of angled segments, each segment oriented at one or more angles relative to the preferred crystal direction to reduce growth enhancement at mask edges.

\* \* \* \* \*